Nov. 5, 1968 J. LINDMAYER ETAL 3,409,482

METHOD OF MAKING A TRANSISTOR WITH A VERY THIN DIFFUSED BASE AND AN EPITAXIALLY GROWN EMITTER

Filed Dec. 30, 1964 2 Sheets-Sheet 1

INVENTORS
Joseph Lindmayer
Richard R. Garnache
James J. Casey
BY Connolly and Hutz
ATTORNEYS INVENTORS
Joseph Lindmayer
Richard R. Garnache
James J. Casey
BY Connolly and Hutz
ATTORNEYS United States Patent Office 3,409,482 Patented Nov. 5, 1968

3,409,482

METHOD OF MAKING A TRANSISTOR WITH A VERY THIN DIFFUSED BASE AND AN EPITAXIALLY GROWN EMITTER

Joseph Lindmayer, Williamstown, Richard R. Garnache, Clarksburg, and James J. Casey, Williamstown, Mass., assignors to Sprague Electric Company, North Adams, Mass., a corporation of Massachusetts Filed Dec. 30, 1964, Ser. No. 422,295
3 Claims. (Cl. 148—175)

ABSTRACT OF THE DISCLOSURE

A planar transistor has a very thin, low resistance base region of one conductivity type diffused within a semiconductive body of the opposite conductivity type at a major surface of the body. An emitter region of the opposite conductivity type is formed on the major surface over the base region by epitaxial growth without significantly increasing the penetration of the diffused base region in the semiconductor body. A PN junction is thereby provided between the diffused base region and the epitaxial grown emitter region. A hole is formed in epitaxially grown emitter region extending down to the diffused base region. Additional impurities of said one conductivity are introduced into the base region at the hole. Ohmic contacts are attached to the base region through the hole and to the emitter region and the semiconductor body.

This invention relates to an improvement in making a planar transistor in a semiconductor body, and more particularly to making the various semiconductor regions of such a transistor.

A planar transistor has electrodes forming essentially parallel planes on the same side of a semiconductor slice. In silicon planar transistors a narrow base region is desirable. It is particularly desirable to make contact easily with the emitter, collector, and base regions of a silicon transistor having a very narrow base region. The planar construction is highly useful as it lends itself to the production of a number of circuit elements and components on a single continuous body of semiconductor material. This multiplicity in turn is desirable in improving the density of parts in electronic circuitry.

A planar transistor in which the thin base region is of low resistance is desirable, because a transistor having short transit times is desirable. It is desirable to produce a continuous base region of very thin dimension. This is particularly important to a switching transistor. Moreover, it is important to make an effective contact with a narrow base region to provide satisfactory transistor operation.

An object of the present invention is to provide an improved method for fabricating planar transistors.

Another object of the invention is to provide a method of producing a planar transistor having a thin base region and desired conductivity gradients.

Still another object of this invention is the provision of a planar switching transistor having a very narrow base region of low resistance.

Figure 5:
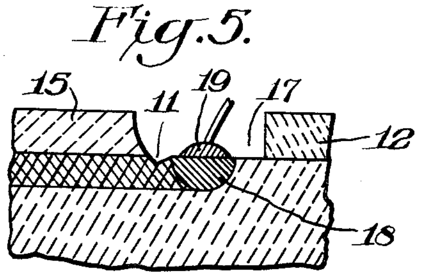
Figure 6:
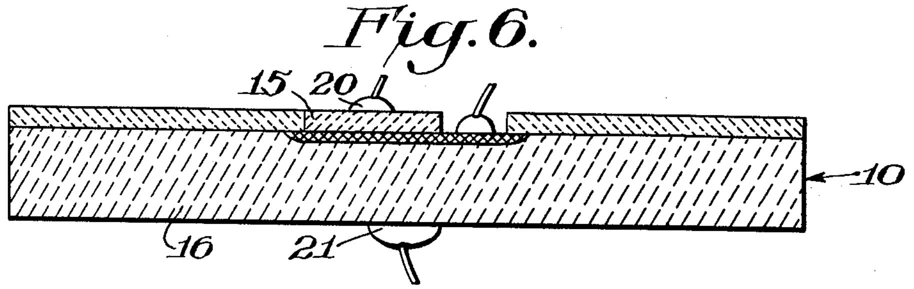
Figure 7:
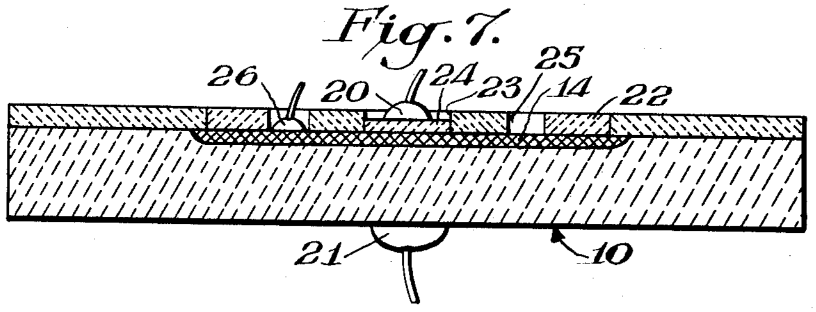

These and other objects of this invention will become more apparent upon consideration of the following description taken together with the accompanying drawings, in which:

FIGURES 1–6 are schematic sectional diagrams illustrative of the method of fabricating the semiconductor device according to this invention; and FIGURE 7 is a schematic sectional diagram illustrative of a method of fabricating a modified semiconductor device according to this invention.

In general, the technique of this invention fabricates planar transistors by providing conductivity regions through the combined process of diffusion and epitaxial growth by vapor deposition. By this technique a fine control is achieved of the base thickness and the impurity profile in the emitter and collector regions.

Briefly, the process consists of first producing an inert mask over part of the plane surface of a silicon substrate and then depositing a controlled quantity of a suitable impurity on the uncovered open surface of the silicon substrate. The substrate and impurity are heat treated to produce a desired distribution of the impurities within the substrate by diffusion. The impurities form a very thin area of low resistance in the silicon substrate. This low resistance region extending across the area of the opening in the mask is the desired narrow base region and substrate is the collector region. Subsequently, there is an epitaxial growth of silicon in the opening in the mask which produces an emitter region without substantially spreading or broadening the narrow base region. The conductivity gradients at the completion of the epitaxial growth are suitable for the short transit times desired. Finally, an effective contact is achieved with the base region on the planar surface of the silicon substrate and electrical contacts are applied to the collector and emitter regions.

Figure 1:
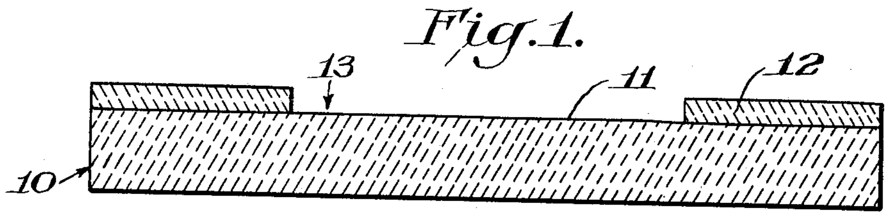

Referring to the figures, the transistor of this invention is a silicon substrate 10 of monocrystalline silicon material. As shown in FIGURE 1, the substrate 10 as a surface 11 to which is applied a masking coat 12 of suitable inert material such as silicon dioxide suitably formed on the surface 11. The coat 12 partially covers the surface 11 to provide an opening 13. The opening 13 may either be formed by masking the surface 11 during the production of the coat 12 or by removing part of the coat 12 after its formation.

The semiconductive material may have either P-type conductivity or N-type conductivity. For example, boron, aluminum, indium and gallium provide the P-type conductivity and phosphorus, antimony and bismuth provide the N-type conductivity. It will be understood that these examples of impurities and conductivities are set forth merely by way of illustration.

According to this invention impurities in the semiconductive substrate 10 produce the collector region which is a region of one of the conductivity types. The diffusion of the impurities into the substrate 10 is controlled to provide a base of desired resistivity. The impurities are diffused into the substrate 10 to form a base region 14 by depositing a predetermined quantity of the impurity material for doping on the surface 11 in the opening 13. It will be understood that the impurity will be either of the P-type or the N-type depending upon and opposite to the collector region. The impurity and the substrate 10 are then heat treated to bring about indiffusion of the impurity.

Figure 2:
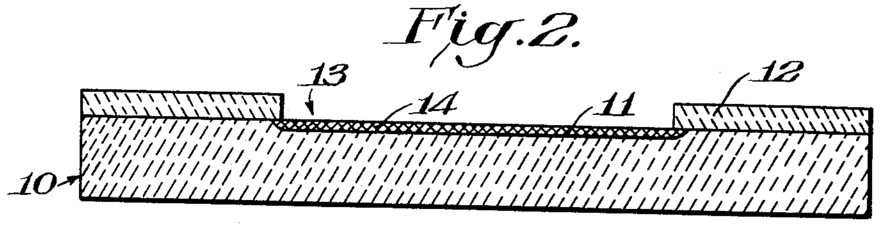

As shown in FIGURE 2 the base region 14 is formed within the substrate 10 in a very thin region extending across the opening 13 and lying just below the surface 11 in the opening 13. The heat treatment producing this indiffusion is carried on so as to produce the desired narrow base region of low resistance.

Figure 3:
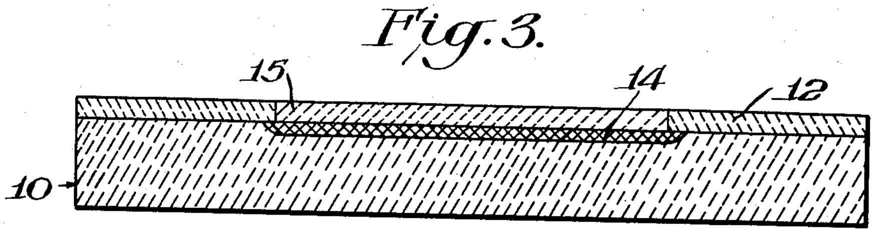

Next a layer of monocrystalline silicon material is epitaxially grown in the opening 13 to produce a layer 15 as shown in FIGURE 3. The layer 15 may be produced by a suitable epitaxial technique, for example, growth from a gaseous silicon tetrachloride in a hydrogen carrier by reduction of the silicon tetrachloride. The layer 15 is grown to provide a thickness suitable for an emitter region which will be of the same type as the collector body.

The epitaxial growth step has a slight and non-determinative effect on the indiffused impurity which provides the narrow base region 14. The region 14 is diffused slightly into the substrate 10. At the same time the region 14 is expanded slightly in width but is otherwise not substantially shifted in position or configuration.

Accordingly it will be understood that the epitaxial growth step does not substantially alter the narrow base region and thus the narrow base region 14 and the subsequently formed epitaxial layer 15 may be produced in the combination of this invention resulting in a structure in which the layer 15 is the emitter region, the narrow base region 14 and a collector region 16 are in the substrate 10.

The substrate 10 and the layer 15 have a monocrystalline structure of the same crystalline arrangement.

Figure 4:
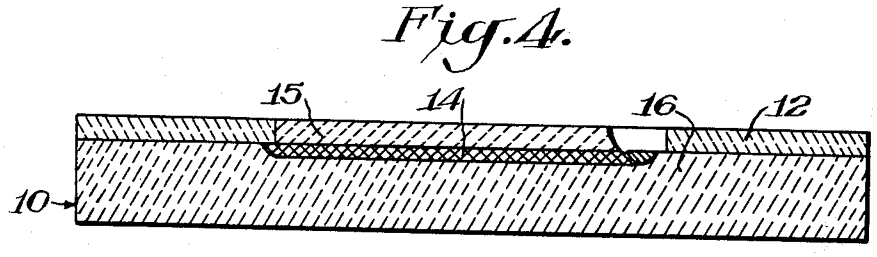

An opening 17 is produced in the coat 12 at a point where the base region 14 extends to the surface 11 as shown in FIGURE 4. A doped impurity introduced into the substrate 10 at the region 14 in the opening 17 provides a region 18 which is characterized by a reduced resistance to electrical connection to the base region 14.

The region 18 in the opening 17 is shown in greater detail in the enlarged section of FIGURE 5. The doped region 18 is the same conductivity as the narrow base region 14 and extends substantially into the narrow base region 14. The doped region 14 is spaced away from the emitter region layer 15. A metal electrode 19 preferably of aluminum is attached to the region 18 as shown in FIGURE 5. Good ohmic contact is achieved because the doped region 18 and the base region 14 are of the same conductivity, even though the doping level may be low.

Finally, as shown in FIGURE 6 a suitable metal contact 20 is attached to the emitter region layer 15 to provide the emitter contact and a suitable metal contact 21 is applied to the collector 16 to provide the collector contact. The transistor device is thus completed.

In a typical production of the embodiment of this invention a silicon wafer forming the substrate 10 was masked with the layer 12 of the silicon dioxide having the opening 13 formed therein. A diborane compound was flash diffused into the surface 11 of the substrate 10 in a five-minute diffusion at a temperature of 1100° C. to provide a concentration of $10^{19}$ impurity atoms/cubic centimeter in a penetration of the substrate 10 to form the region 14 having a thickness of slightly more than .011 mil. The epitaxial layer 15 of silicon was grown in the opening 13 by reduction of silicon tetrachloride in hydrogen at a temperature of 1200° C. The epitaxial growth was carried on for about five minutes at a growth rate of a micron a minute. The region 14 increased in width to .012 mil after the epitaxial growth. A transistor was produced with a high conductivity extremely thin base region.

In accordance with procedures that have become standard in silicon planar devices the protective passivating layer 12 of silicon dioxide is provided over the surface 11 of the substrate 10. These standard procedures also provide a layer 22 in the modified embodiment of this invention shown in FIGURE 7. The structure of FIGURE 7 is provided by first forming the base region 14 within the substrate 10. As shown in FIGURE 2 the very thin region 14 extends across the opening 13 and lies just below the surface 11. Next the passivating layer 22 of silicon dioxide is provided over the surface 11 in the opening 13. An opening 23 is formed by removing part of the layer 22 in the center. By preferential removal the opening 23 extends through the layer 22 to the surface 11 and the base region 14. According to this embodiment a layer of monocrystalline silicon material is epitaxially grown in the opening 23 to produce a layer 24 as shown in FIGURE 7. The layer 24 may be produced by a suitable growth from gaseous silicon tetrachloride in a hydrogen carrier by reduction as described above in the production of layer 15. The layer 24 is grown to provide a thickness suitable for an emitter region.

Next in the embodiment of FIGURE 7, a circular opening 25 is formed in the layer 22 extending through the layer 22 to the surface 11 and to the base region 14. The circular opening 25 encompasses and is separated from the opening 23 and the emitter region layer 24. Two cross sections of the ring-like opening 25 appear in the FIGURE 7 sectional view. Thus access is provided for connection to the base region. Ohmic contact to the base region 14 is provided by a metal contact 26 in the opening 25 on the surface 11. If desired contact 26 may be a ring contact. Emitter and collector metal contacts 20 and 21 respectively may be attached to their respective regions as described above in connection with the embodiment of FIGURE 6.

It should be understood that the described embodiments of this invention are only for the purpose of illustration. The principle of this invention is employed in variations without departing from the spirit of this invention as exemplified in the modifications indicated above, and therefore it is intended that the invention be limited only by the scope of the appended claims.

We claim:

1. A method of making a semiconductor device having a base region of the order of .012 mil comprising the steps of:

providing a monocrystalline semiconductor body of a first conductivity;

providing a masking coating on said body;

forming a hole of predetermined shape in said coating;

diffusing a second conductivity type impurity through said hole in said coating into a major surface of said semiconductor body for a period of about five minutes and in a concentration so as to produce a second type conductivity region extending in said first type conductivity body to about .011 mil from said major surface;

subsequently depositing at a growth rate of about 1 micron a minute an epitaxial layer of semiconductor material of said first type conductivity on said major surface overlying said second type conductivity region, whereby the depth of penetration of said second type conductivity region increases no more than about .001 mil;

forming an opening in said epitaxial layer extending to said second type conductivity region at said major surface;

introducing additional second type conductivity impurities into said second type conductivity region at said opening;

attaching an ohmic contact to said second type conductivity region at the point where said additional impurity was introduced;

and attaching ohmic contacts to said first type conductivity body and said epitaxial layer.

2. The method of making a semiconductor device having a thin region as claimed in claim 1 in which said first conductivity type is P-type and said opposite conductivity type is N-type.

3. The method of making a semiconductor device having a thin region as claimed in claim 1 in which said first conductivity type is N-type and said opposite conductivity type is P-type.

References Cited

UNITED STATES PATENTS

| | | | |
|---|---|---|---|
| 3,000,768 | 9/1961 | Marinace | 148—175 |
| 3,040,219 | 6/1962 | Fulop | 148—33.5 |
| 3,047,438 | 7/1962 | Marinace | 148—175 |
| 3,057,762 | 10/1962 | Gans | 148—33.4 |
| 3,064,167 | 11/1962 | Hoerni | 148—187 |
| 3,089,794 | 5/1963 | Marinace | 148—175 |
| 3,149,395 | 9/1964 | Bray et al. | 148—175 |
| 3,152,928 | 10/1964 | Hubner | 148—33.5 |
| 3,243,323 | 3/1966 | Corrigan et al. | 148—175 |
| 3,278,347 | 10/1966 | Topas | 148—175 |
| 3,309,240 | 3/1967 | Zook et al. | 148—33.1 |
| 3,156,591 | 11/1964 | Hale | 148—1.5 XR |
| 3,312,881 | 4/1967 | Yu | 148—186 XR |
| 3,321,340 | 3/1967 | Murphy | 148—175 |

L. D. RUTLEDGE, *Primary Examiner.*

P. WEINSTEIN, *Assistant Examiner.*